(12) United States Patent
Beaupre et al.

(10) Patent No.: US 8,982,558 B2
(45) Date of Patent: Mar. 17, 2015

(54) COOLING DEVICE FOR A POWER MODULE, AND A RELATED METHOD THEREOF

(75) Inventors: Richard Alfred Beaupre, Pittsfield, MA (US); Joseph Lucian Smolenski, Slingerlands, NY (US); William Dwight Gerstler, Niskayuna, NY (US); Xiaochun Shen, Cohoes, NY (US)

(73) Assignee: General Electric Company, Niskayuna, NY (US)

( * ) Notice: Subject to any disclaimer, the term of this patent is extended or adjusted under 35 U.S.C. 154(b) by 859 days.

(21) Appl. No.: 13/168,030

(22) Filed: Jun. 24, 2011

(65) Prior Publication Data
US 2012/0327603 A1 Dec. 27, 2012

(51) Int. Cl.
*H05K 7/20* (2006.01)
*H01L 23/473* (2006.01)

(52) U.S. Cl.
CPC ....... *H01L 23/473* (2013.01); *H01L 2924/0002* (2013.01)
USPC ...... 361/702; 361/699; 361/704; 165/104.19; 165/104.33; 165/173; 165/185; 257/714

(58) Field of Classification Search
USPC ............. 361/699, 702, 704; 165/104.19, 173, 165/175, 104.33; 11/699, 702; 257/714
See application file for complete search history.

(56) References Cited

U.S. PATENT DOCUMENTS

| 5,099,910 | A | 3/1992 | Walpole et al. |
| 5,727,618 | A * | 3/1998 | Mundinger et al. ......... 165/80.4 |
| 5,801,442 | A | 9/1998 | Hamilton et al. |
| 6,992,382 | B2 * | 1/2006 | Chrysler et al. ............. 257/717 |
| 7,190,580 | B2 | 3/2007 | Bezama et al. |
| 7,212,405 | B2 | 5/2007 | Prasher et al. |
| 7,353,859 | B2 | 4/2008 | Stevanovic et al. |
| 7,360,582 | B2 | 4/2008 | Olesen |
| 7,388,746 | B2 * | 6/2008 | Park et al. ..................... 361/699 |
| 7,427,566 | B2 * | 9/2008 | Durocher et al. ............ 438/689 |

(Continued)

OTHER PUBLICATIONS

Leslie; "Heat Sinks: Cooling Options and Challenges of High Power Semiconductor Modules"; Electronics Cooling, Nov. 1, 2006; 7 Pages.

Remsburg et al., "Direct Integration of IGBT Power Modules to Liquid Cooling Arrays"; 23rd International Electric Vehicle Symposium and Exposition, Dec. 2-5, 2007; pp. 366-391.

(Continued)

*Primary Examiner* — Robert J Hoffberg
(74) *Attorney, Agent, or Firm* — Jason K. Klindtworth

(57) ABSTRACT

A cooling device for a power module having an electronic module disposed on a base plate via a substrate is disclosed. The cooling device includes a heat sink plate having at least one cooling segment. The cooling segment includes an inlet plenum for entry of a cooling medium, a plurality of inlet manifold channels, a plurality of outlet manifold channels, and an outlet plenum. The plurality of inlet manifold channels are coupled orthogonally to the inlet plenum for receiving the cooling medium from the inlet plenum. The plurality of outlet manifold channels are disposed parallel to the inlet manifold channels. The outlet plenum is coupled orthogonally to the plurality of outlet manifold channels for exhaust of the cooling medium. A plurality of millichannels are disposed in the base plate orthogonally to the inlet and the outlet manifold channels. The plurality of milli channels direct the cooling medium from the plurality of inlet manifold channels to the plurality of outlet manifold channels.

10 Claims, 2 Drawing Sheets

(56) References Cited

U.S. PATENT DOCUMENTS

| | | | |
|---|---|---|---|
| 7,755,898 B2 | 7/2010 | Aoki et al. | |
| 7,759,144 B2* | 7/2010 | Wall, Jr. | 438/25 |
| 7,760,503 B2 | 7/2010 | Aoki et al. | |
| 7,836,940 B2 | 11/2010 | Campbell et al. | |
| 7,898,807 B2* | 3/2011 | Beaupre et al. | 361/699 |
| 8,902,589 B2* | 12/2014 | Gohara et al. | 361/699 |
| 2007/0215325 A1* | 9/2007 | Solovitz et al. | 165/80.4 |
| 2010/0175857 A1 | 7/2010 | Gerstler et al. | |
| 2010/0226093 A1 | 9/2010 | Beaupre et al. | |
| 2010/0302734 A1* | 12/2010 | Beaupre et al. | 361/700 |
| 2014/0043765 A1* | 2/2014 | Gohara et al. | 361/699 |

OTHER PUBLICATIONS

Mital et al.; "Thermal Design Methodology for an Embedded Power Electronic Module Using Double-Sided Microchannel Cooling"; Journal of Electronic Packaging, vol. 130, Issue 3, Sep. 2008; 11 Pages.

Joseph et al.; "A Numerical Study on Natural Convection in Mini Channel Using Water and Water-Alumina Nanofluid"; 10th National Conference on Technological Trends, Nov. 6-7, 2009; 6 Pages.

Stevanovic et al., "Integral Micro-Channel Liquid Cooling for Power Electronics", Twenty-Fifth Annual Applied Power Electronics Conference and Exposition, Feb. 21-25, 2010, Palm Springs, CA; pp. 1591-1597.

\* cited by examiner

COOLING DEVICE FOR A POWER MODULE, AND A RELATED METHOD THEREOF

BACKGROUND

The invention relates generally to cooling devices, and more particularly, to a cooling device having integrated millichannels for a power module.

Power electronics refers to the application of solid-state electronics related to the control and conversion of electrical power. This conversion is typically performed by silicon, silicon carbide, and gallium nitride devices that are packaged into power modules. One of the factors associated with the power modules is the generation of heat. While the heat generated by the power modules is due to many factors, it generally relates to the fact that the power module efficiency is always less than 100 percent, and the efficiency loss is typically generated as heat. Unfortunately, the power module performance tends to erode with increased temperatures.

An additional factor for thermal management relates to the packaging of a number of devices in small footprints. The power density, at which the devices, and thus the module can operate, therefore depends on the ability to remove this generated heat. The common form of thermal management of power electronics is through heat sinks. Heat sinks operate by transferring the heat away from the heat source of the power module, thereby maintaining the heat source at a lower relative temperature. There are various types of heat sinks known in the thermal management field including air-cooled and liquid-cooled devices.

One example of the thermal management of a power module includes the attachment of a heat sink with embedded tubes to provide liquid cooling of the power module. The heat sink is typically a metallic structure, such as aluminum or copper. A cooling medium such as water is passed through the tubes to cool the power module. The heat sink is typically coupled to the power module base with a thermal interface material (TIM) dispersed there between. The thermal interface material may comprise thermal greases, compliant thermal pads, or the like. The conventional cooling devices have large thermal gradients and high-pressure drops across the devices. Also, the conventional cooling devices have large thermal resistance, which limits operation levels of the power module.

There is a need for an improved cooling device.

BRIEF DESCRIPTION

In accordance with one exemplary embodiment of the present invention, a cooling device for a power module having an electronic module disposed on a base plate via a substrate is disclosed. The cooling device includes a heat sink plate having at least one cooling segment. The cooling segment includes an inlet plenum for entry of a cooling medium. A plurality of inlet manifold channels are coupled orthogonally to the inlet plenum for receiving the cooling medium from the inlet plenum. A plurality of outlet manifold channels are disposed parallel to the inlet manifold channels. An outlet plenum is coupled orthogonally to the plurality of outlet manifold channels for exhaust of the cooling medium. A plurality of millichannels are disposed in the base plate orthogonally to the inlet and the outlet manifold channels. The plurality of milli channels direct the cooling medium from the plurality of inlet manifold channels to the plurality of outlet manifold channels.

In accordance with another exemplary embodiment of the present invention, a power module having an exemplary cooling device is disclosed.

In accordance with another exemplary embodiment of the present invention, a method includes directing a cooling medium via an inlet plenum of at least one cooling segment of a heat sink plate. The method further includes directing the cooling medium from the inlet plenum to a plurality of inlet manifold channels coupled orthogonally to the inlet plenum in the at least one cooling segment of the heat sink plate. The method also includes directing the cooling medium from the plurality of inlet manifold channels to a plurality of outlet manifold channels disposed parallel to the inlet manifold channels in the at least one cooling segment of the heat sink plate via a plurality of millichannels disposed in the base plate orthogonally to the inlet and the outlet manifold channels so as to cool an electronic module mounted on a base plate via a substrate. The method further includes exhausting the cooling medium from the plurality of outlet manifold channels via an outlet plenum coupled orthogonally to the plurality of outlet manifold channels.

In accordance with another exemplary embodiment of the present invention, a method for manufacturing an exemplary cooling device for a power module is disclosed.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in accordance with the embodiments discussed herein, a cooling device for a power module is disclosed. In certain embodiments, the cooling device includes a heat sink plate having at least one cooling segment. The cooling segment includes an inlet plenum for entry of a cooling medium. A plurality of inlet manifold channels are coupled orthogonally to the inlet plenum for receiving the cooling medium from the inlet plenum. A plurality of outlet manifold channels are disposed parallel to the inlet manifold channels. An outlet plenum is coupled orthogonally to the plurality of outlet manifold channels for exhaust of the cooling medium. A plurality of millichannels are disposed in the base plate of the power module orthogonally to the inlet and the outlet manifold channels. The plurality of millichannels direct the cooling medium from the plurality of inlet manifold channels to the plurality of outlet manifold channels. It should be noted herein aspects of the present invention relate generally to heat sinks, stacks, and apparatuses using the heat sinks, and more particularly to millichannel heat sinks. It should be noted herein, that a "millichannel" has a width and a height on the order of millimeters in each dimension.

Figure 1:
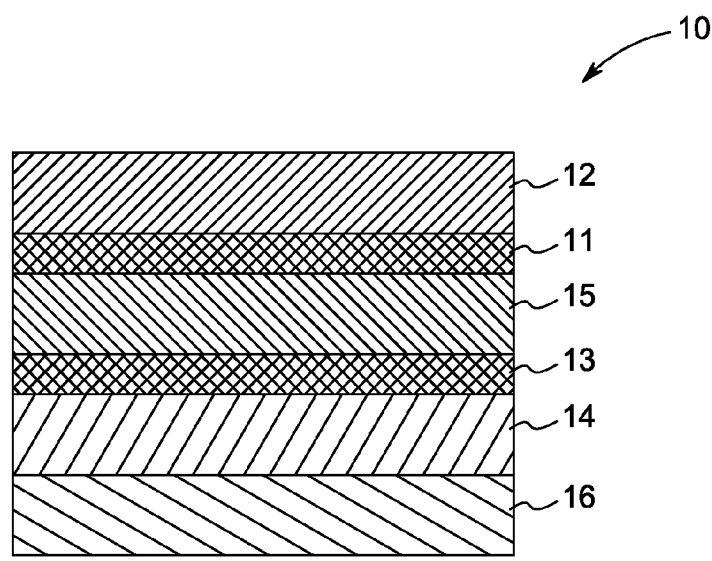
FIG. 1 is a cross-sectional view of a power module in accordance with an exemplary embodiment of the present invention.

Referring to FIG. 1, a power module 10 includes an electronic module 12 that generate heat during operation, a base plate 14, a substrate 15, and a heat sink plate 16. The electronic module 12 is disposed on the base plate 14 via the substrate 15. The base plate 14 is provided on the heat sink plate 16. In one embodiment, the electronic module 12 is standardized such as a commercial off the shelf (COTS) part so that the shape, holes, and features of the electronic module 12 are matched to the base plate 14. Additionally, the heat sink plate 16 also may be standardized so that the shape, holes and features of heat sink plate 16 are matched to the base plate 14. Non-limiting examples of the electronic module 12 may include insulated gate bipolar Transistors (IGBT), metal oxide semiconductor field effect transistors (MOSFET), diodes, metal semiconductor field effect transistors (MESFET), and high electron mobility transistors (HEMT) used for applications not limited to automotive applications, oil and gas applications, or the like. According to embodiments of the present invention, the electronic device may be manufactured from a variety of semiconductors, non-limiting examples of which include silicon, silicon carbide, gallium nitride, and gallium arsenide.

The substrate 15 is provided to avoid electrical short circuits and to perform heat exchange between the base plate 14 and the electronic module 12. In one embodiment, the substrate 15 is an electrically isolating and thermally conductive layer, such as a ceramic layer. Non-limiting examples of the ceramic layer may include aluminum oxide, aluminum nitride, beryllium oxide, and silicon nitride. In a specific embodiment, the ceramic layer 15 may be bonded to the base plate 14 and the electronic module 12 via top and bottom conductive layers 11, 13 (for example, copper layers), i.e. substrate 15 may have either a direct bonded copper (DBC), or an active metal braze (AMB) structure. In other words, the top conductive layer 11 may be disposed between the electronic module 12 and the ceramic layer 15 and the bottom conductive layer 13 may be disposed between the ceramic layer 15 and the base plate. In a particular embodiment, an aluminum layer, a gold layer, a silver layer, or an alloy layer may be preferred instead of the copper layer. In another embodiment, the base plate 14 may be directly bonded to the substrate 15. The substrate 15 may be coupled to the base plate 14 and the electronic module 12 using a number of techniques, including but not limited to, brazing, bonding, diffusion bonding, soldering, or pressure contact such as clamping to provide a simple assembly process. It should be noted herein that the exemplary arrangement in FIG. 1 is illustrative, and the invention is by no means limited by this arrangement.

Figure 2:
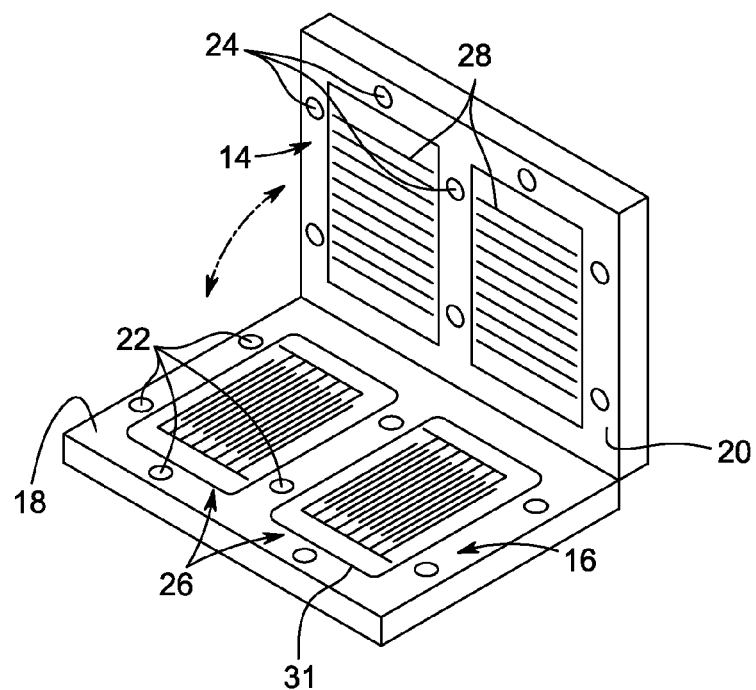
FIG. 2 is a disassembled perspective view of a power module having a cooling device in accordance with an exemplary embodiment of the present invention.

Referring to FIG. 2, a disassembled view of the power module 10 is illustrated. As discussed previously, the base plate 14 is provided on the heat sink plate 16. The heat sink plate 16 has a heat sink surface 18 disposed to face a plate surface 20 of the base plate 14. The heat sink surface 18 has a plurality of holes 22 and the plate surface 20 has a plurality of corresponding holes 24 formed therein. Fasteners may be coupled to the holes 22, 24 to detachably couple the heat sink surface 18 to the plate surface 20.

In the illustrated embodiment, the heat sink plate 16 includes a plurality of cooling segments 26 disposed in the heat sink surface 18. In one embodiment, the plurality of cooling segments 26 are recessed in the heat sink surface 18 of the heat sink plate 16. The base plate 14 includes sets of millichannels 28 disposed in the plate surface 20. Each set of millichannels 28 is positioned to overlap the corresponding cooling segment 26. In embodiments of the invention, each of the millichannels 28 are recessed into the plate surface 20 of the base plate 14 to form trenches in the plate surface 20. In the illustrated embodiment, the heat sink plate 16 has a rectangular shape. It should be noted that the exemplary heat sink plate 16 in FIG. 2 is illustrative, and the heat sink plate 16 may also have other shapes, such as circular, triangular or polygonal shapes. The cooling segments 26 and the set of millichannels 28 together form a cooling device for the power module 10. In embodiments of the invention, the cooling device is configured to cool the electronic module 12. The cooling device is illustrated and described in more detail in FIG. 4.

The heat sink plate 16 may include at least one thermally conductive material, non-limiting examples of which may include copper, aluminum, nickel, molybdenum, titanium, and alloys thereof. In some embodiments, the heat sink plate 16 may include metal matrix composites such as aluminum silicon, aluminum silicon carbide, aluminum graphite, and copper graphite. In other embodiments, the heat sink plate 16 may include ceramics such as aluminum oxide and silicon nitride ceramic. Alternatively, the heat sink plate 16 may include at least one thermoplastic material.

For the exemplary arrangement in FIG. 2, each cooling segment 26 is coupled to the corresponding set of millichannels 28. The coupling between the cooling segment 26 and the set of millichannels 28 are explained in more detail with reference to FIGS. 3 and 4. Each cooling segment 26 is surrounded by a seal 31 to prevent the coolant in the corresponding cooling segment 26 from leakage and provide a liquid tight seal. The seal 31 may include a gasket, an O-ring, or any other type of seal, such as metallurgical bonding with a similar function. A cooling medium is circulated through the cooling segment 26 and the set of millichannnels 28 to enable heat exchange between the base plate 14 and the heat sink plate 16. In certain embodiments, similar to the heat sink plate 16, the base plate 14 may also include at least one thermally conductive material, non-limiting examples of which may include thermo pyrolytic graphite (TPG), copper, aluminum, nickel, molybdenum, titanium, and alloys of copper, aluminum, nickel, molybdenum, titanium. In some embodiments, the base plate 14 may also include metal matrix composites such as aluminum silicon carbide, aluminum graphite, and copper graphite. In another embodiment, the base plate 14 may include ceramics such as aluminum oxide and silicon nitride ceramic. In a particular embodiment, the base plate 14 may also include at least one thermoplastic material.

Figure 3:
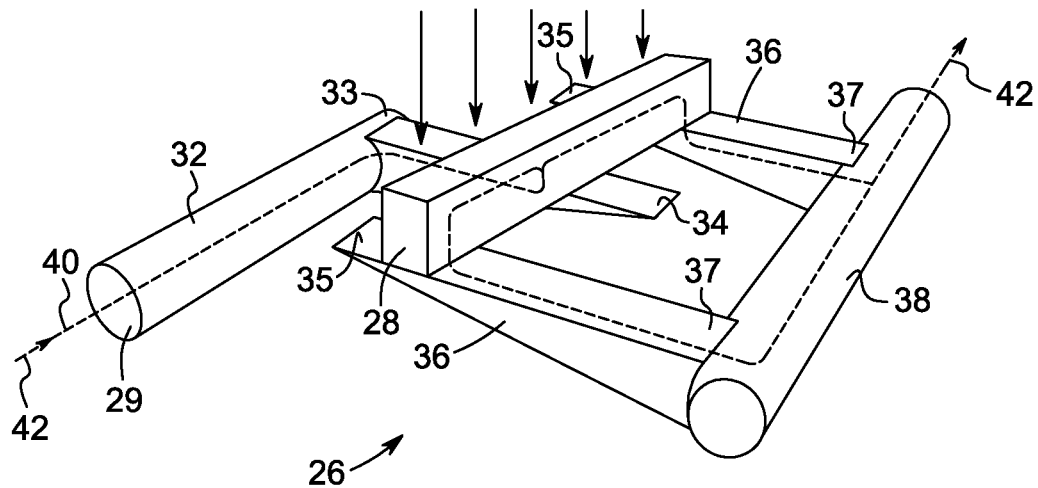
FIG. 3 is a diagrammatical representation of a cooling device of a power module in accordance with an exemplary embodiment of the present invention.

Referring to FIG. 3, a portion of the cooling segment 26 and a millichannel 28 is illustrated. In the illustrated embodiment, the portion of the cooling segment 26 includes an inlet plenum 32 having a first end 29 and a second end 33, and an inlet manifold channel 34 coupled orthogonally to the second end 33 of the inlet plenum 32. Although only a single inlet manifold channel 34 is shown, cooling segment 26 will typically have multiple such inlet manifold channels. Two outlet manifold channels 36 are disposed parallel to the inlet manifold channel 34. In one embodiment, the inlet manifold channel 34 and the outlet manifold channels 36 have the same dimensions. Each outlet manifold channel 36 includes an end 35 and another end 37. An outlet plenum 38 is coupled orthogonally to the end 37 of the outlet manifold channels 36. The outlet plenum 38 may have the same dimensions as that of the inlet plenum 32. As discussed previously, the base plate 14 includes sets of millichannels 28 disposed in the plate surface. In the illustrated embodiment, one millichannel 28 is shown. The millichannnels 28 are disposed orthogonally to the inlet and outlet manifold channels 34, 36. In some embodiments, the millichannnels 28 are coupled directly to the inlet and outlet manifold channels 34, 36. In certain other embodiments, the millichannels 28 are coupled via connecting paths (not shown) to the inlet and outlet manifold channels 34, 36. In a specific embodiment, the millichannel has a width of 1 mm and a depth of 3 mm. It should be noted herein that the inlet manifold channel 34 has a tapering cross-section from the second end 33 of the inlet plenum 32 towards the millichannels 28. Also, the outlet manifold channel 36 has a tapering cross section from the end 37 towards the millichannels 28.

In certain embodiments of the invention, the millichannels 28 may have a rectangular or square cross-section. Non-limiting examples of the cross sections of the millichannels 28 may further include circular, triangular, trapezoidal, and u-shaped cross-sections. The millichannels 28 may be cast, machined, or etched, and may be smooth or rough in the base plate. The rough millichannels may have relatively larger surface area to enhance turbulence of a cooling medium 40 so as to augment thermal transfer therein. In non-limiting examples, the millichannels 28 may employ features such as dimples, bumps, or the like therein to increase the roughness thereof. Similarly to the millichannels 28, the manifold channels 34, 36 may also have a variety of cross-sectional shapes, including but not limited to, round, circular, triangular, trapezoidal, and square/rectangular cross-sections. The geometry of the plenums 32, 38, the manifold channels 34, 36, and the millichannels 28 may be designed based on the application, type of cooling medium used, and also the ambient temperature. The number of manifold channels 34, 36, and millichannels 28 may vary depending on the application.

In an exemplary operation, the cooling medium 40 enters the inlet manifold channels 34 via the inlet plenum 32. A supply source (not shown) is used to pump the cooling medium 40 into the inlet plenum 32. The cooling medium 40 is then directed from the inlet manifold channels 34 to the outlet manifold channels 36 via the millichannels 28 of the base plate. Thereafter, the cooling medium 40 is exhausted from the outlet manifold channels via the outlet plenum 38. It should be noted herein that entry of the cooling medium 40 into the inlet plenum 32 and exhaust of the cooling medium 40 from the outlet plenum 38 are along a same direction 42. In one embodiment, the cooling medium 40 includes a mixture of propylene glycol and water. In a specific embodiment, the cooling medium 40 may include 60 percent by weight of propylene glycol and 40 percent by weight of water. The cooling medium 40 may also include other electrically conductive or non-electrically conductive liquids. In another embodiment, the cooling medium 40 may include a gaseous medium. Accordingly, when the electronic module 12 and the base plate 14 are disposed on the heat sink plate 16, the cooling medium 40 flowing through the heat sink plate and the millichannels 28 of the base plate enable cooling of the electronic module.

The configuration of the cooling segment 26 discussed herein, specifically relating to parallel arrangement of the inlet manifold channels 34, and outlet manifold channels 36, tapered cross-sections of the channels (34, 36), orthogonal arrangement of the plenums (32, 38), and the millichannnels 28 provide a relatively large flow area resulting in constant flow velocity and low pressure drop across the segment 26. The thermal gradient across the segment 26 is minimized. The thermal resistance and thermal resistivity of the power module is minimal enabling the power module to be operated at higher power levels. As noted below:

$$\text{amount of power} = \frac{\text{change in temperature}}{\text{thermal resistance (losses)}}$$

Thus, the power level of the module is increased with lower thermal resistance and higher changes in temperature.

Figure 4:
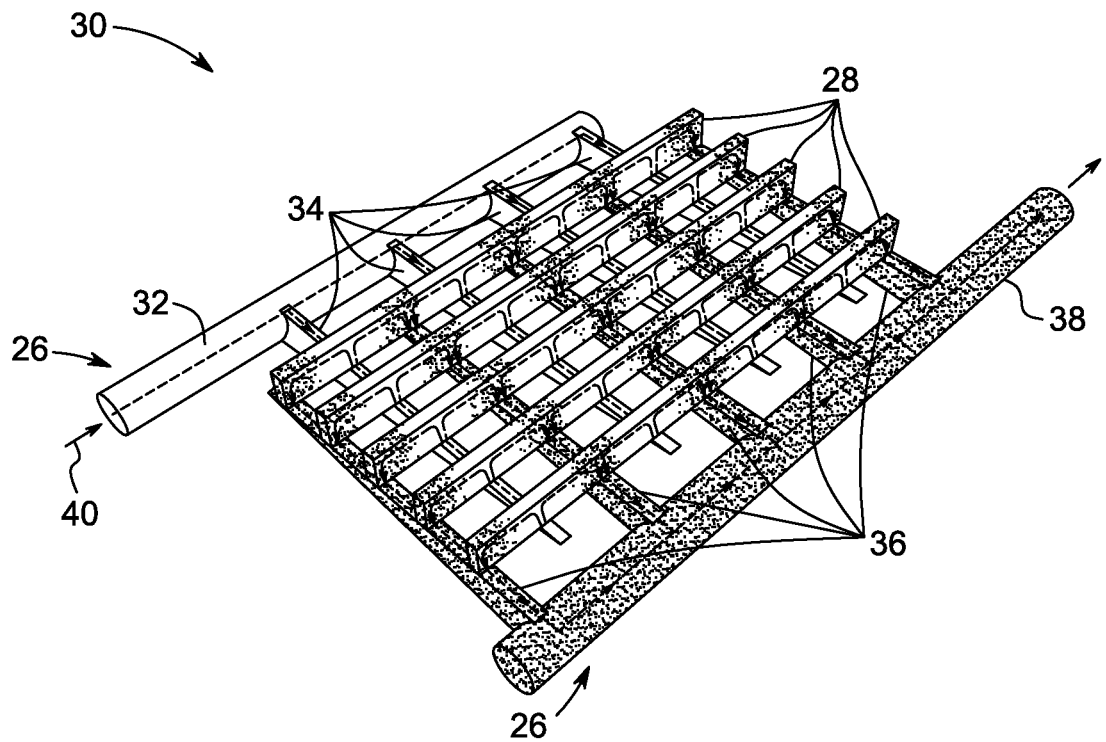
FIG. 4 is a perspective view of a cooling device in accordance with an exemplary embodiment of the present invention.

Referring to FIG. 4, the cooling device 30 is illustrated in accordance with an exemplary embodiment of the present invention. In the illustrated embodiment, the cooling device 30 includes the cooling segment 26 of FIG. 3 having the inlet plenum 32, and a plurality of inlet manifold channels 34 coupled orthogonally to the inlet plenum 32. The device 30 also includes a plurality of outlet manifold channels 36 disposed parallel to the plurality of inlet manifold channels 34. The outlet plenum 38 is coupled orthogonally to the plurality of outlet manifold channels 36. As discussed previously, the base plate includes sets of millichannels 28 disposed in the plate surface 20. In the illustrated embodiment, one set of millichannels 28 is shown. The set of millichannnels 28 are disposed orthogonally to the plurality of inlet and outlet manifold channels 34, 36. As discussed earlier, the plurality of inlet manifold channels 34 have a tapering cross-section from the inlet plenum 32 towards the set of millichannels 28. Also, the plurality of outlet manifold channels 36 have a tapering cross section from the outlet plenum 38 towards the set of millichannels 28.

Accordingly, for the exemplary arrangement, when the heat sink plate is coupled to the base plate, and the cooling medium 40 is directed sequentially through the inlet plenum 32, the plurality of inlet manifold channels 34, the set of millichannels 28, the plurality of outlet manifold channels 36, and the outlet plenum 38, heat exchange between the base plate and the heat sink plate results so as to cool the electronic module. The seal provides a liquid tight seal about the cooling segment of the heat sink plate.

Referring to FIGS. 1-4, in some embodiments the base plate 14 having sets of millichannels 28, and the heat sink plate 16 having the plurality of cooling segments 26 may be prefabricated. In certain other embodiments, the cooling device 30 may be cast, machined, or etched into an existing power module. For example, with reference to FIGS. 1 and 2, the base plate 14 may be detached from the substrate 15. An existing heat sink plate (not shown) may then be detached from the base plate 14. A plurality of millichannels 28 may be formed in the plate surface 20 of the base plate 14. The existing heat sink plate may then be replaced by the heat sink plate 16 having a plurality of cooling segments 26 formed in the heat sink surface 18. The heat sink plate 16 then may be coupled to the base plate 14 so that the plate surface 20 overlaps the heat sink surface 18. The base plate 14 then may be coupled to the substrate 15. It should be noted herein that in such an embodiment, the sequence of events in the manufacturing may vary depending on the requirement. The power module having the exemplary cooling arrangement described herein has lower thermal resistance and resistivity, and larger thermal capacitance than previously known power modules.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power module comprising:
   a base plate;
   an electronic module mounted on the base plate via a top conductive layer, a substrate, and a bottom conductive layer;
   a heat sink plate detachably coupled to the base plate and including at least one cooling segment, wherein the at least one cooling segment comprises:
      an inlet plenum for entry of a cooling medium,
      a plurality of inlet manifold channels coupled orthogonally to the inlet plenum for receiving the cooling medium from the inlet plenum,
      a plurality of outlet manifold channels disposed parallel to the inlet manifold channel, and
      an outlet plenum coupled orthogonally to the plurality of outlet manifold channels for exhaust of the cooling medium;
   a plurality of millichannels, each millichannel having a width and a height on an order of millimeters, disposed in the base plate orthogonally to the inlet and the outlet manifold channels, wherein the plurality of millichannels direct the cooling medium from the plurality of inlet manifold channels to the plurality of outlet manifold channels; and
   a seal disposed surrounding the at least one cooling segment to prevent the cooling medium in the at least one cooling segment from leakage.

2. The power module of claim 1, wherein the heat sink plate comprises a heat sink surface having the at least one cooling segment disposed therein.

3. The power module of claim 2, wherein the base plate comprises a plate surface having the plurality of millichannels disposed therein.

4. The power module of claim 3, wherein the heat sink surface is disposed facing the plate surface.

5. The power module of claim 1, wherein the inlet plenum is disposed parallel to the outlet plenum.

6. The power module of claim 5, wherein an entry of the cooling medium into the inlet plenum and the exhaust of the cooling medium from the outlet plenum are along a same direction.

7. The power module of claim 1, wherein each inlet manifold channel among the plurality of inlet manifold channels have a cross-section tapering from the inlet plenum towards the outlet plenum.

8. The power module of claim 1, wherein each outlet manifold channel among the plurality of outlet manifold channels have a cross-section tapering from the outlet plenum towards the inlet plenum.

9. The power module of claim 1, wherein the cooling medium comprises a mixture of propylene glycol and water.

10. A method comprising:
    directing a cooling medium via an inlet plenum of at least one cooling segment of a heat sink plate;
    directing the cooling medium from the inlet plenum to a plurality of inlet manifold channels coupled orthogonally to the inlet plenum in the at least one cooling segment of the heat sink plate;
    directing the cooling medium from the plurality of inlet manifold channels to a plurality of outlet manifold channels disposed parallel to the inlet manifold channels in the at least one cooling segment of the heat sink plate via a plurality of millichannels, each millichannel having a width and a height on an order of millimeters, disposed in a base plate orthogonally to the inlet and the outlet manifold channels so as to cool an electronic module mounted on the base plate via a top conductive layer, a substrate, and a bottom conductive layer; wherein the heat sink plate is detachably coupled to the base plate and includes a seal disposed surrounding the at least one cooling segment to prevent the cooling medium in the at least one cooling segment from leakage;
    exhausting the cooling medium from the plurality of outlet manifold channels via an outlet plenum coupled orthogonally to the plurality of outlet manifold channels.

* * * * *

UNITED STATES PATENT AND TRADEMARK OFFICE
CERTIFICATE OF CORRECTION

Page 1 of 1

PATENT NO. : 8,982,558 B2
APPLICATION NO. : 13/168030
DATED : March 17, 2015
INVENTOR(S) : Beaupre et al.

It is certified that error appears in the above-identified patent and that said Letters Patent is hereby corrected as shown below:

In the Claims

In Column 7, Line 15, in Claim 1, delete "channel," and insert -- channels, --, therefor.

Signed and Sealed this
Twenty-ninth Day of September, 2015

Michelle K. Lee
*Director of the United States Patent and Trademark Office*